United States Patent
Ohtake et al.

(10) Patent No.: US 9,506,143 B2
(45) Date of Patent: Nov. 29, 2016

(54) PROTECTIVE FILM AND METHOD FOR PRODUCING SAME

(75) Inventors: Naoto Ohtake, Yokosuka (JP); Makoto Matsuo, Yokohama (JP); Yoshinao Iwamoto, Hujimi (JP)

(73) Assignee: IMOTT INC., Yokohama-shi (JP)

( * ) Notice: Subject to any disclaimer, the term of this patent is extended or adjusted under 35 U.S.C. 154(b) by 768 days.

(21) Appl. No.: 13/394,537

(22) PCT Filed: Sep. 10, 2010

(86) PCT No.: PCT/JP2010/066111
§ 371 (c)(1),
(2), (4) Date: Mar. 6, 2012

(87) PCT Pub. No.: WO2011/030926
PCT Pub. Date: Mar. 17, 2011

(65) Prior Publication Data
US 2012/0189823 A1    Jul. 26, 2012

(30) Foreign Application Priority Data
Sep. 11, 2009 (JP) ................. 2009-210740

(51) Int. Cl.
*B05D 3/06* (2006.01)
*C23C 16/04* (2006.01)
(Continued)

(52) U.S. Cl.
CPC ............ *C23C 16/042* (2013.01); *C23C 14/04* (2013.01); *C23C 14/042* (2013.01); *C23C 16/04* (2013.01); *C23C 16/26* (2013.01); *Y10T 428/24802* (2015.01)

(58) Field of Classification Search
CPC ..... C23C 14/04; C23C 16/04; C23C 16/042; C23C 16/26
USPC ................................ 427/256, 271
See application file for complete search history.

(56) References Cited

U.S. PATENT DOCUMENTS 4,485,124 A    11/1984  Ciparisso
4,673,795 A *   6/1987  Ortiz, Jr. .................... 219/121.6
(Continued)

FOREIGN PATENT DOCUMENTS

CA    2 702 899 A1    4/2009
CN      1721569 A     1/2006
(Continued)

OTHER PUBLICATIONS

Machine Translation of JP 2003-147525, Otake et al. via AIPN online machine translator.*

(Continued)

*Primary Examiner* — Xiao Zhao
(74) *Attorney, Agent, or Firm* — Lewis Roca Rothgerber Christie LLP

(57) ABSTRACT

The problems in accordance with the present invention are: to provide a DLC film, wherein a protective film having a segmented shape is easily formed, quality control of the protective film is improved, segmented shapes with a high degree of freedom (that are complicated) are possible, and the application of the DLC film is possible not only to two-dimensional shapes but also to three-dimensional shapes; and to provide a method for forming the DLC film. As solutions to the problems, there are provided a protective film and a method for producing the protective film, characterized by, when forming on a substrate the protective film having a segmented shape formed by depositing a film so that the film is formed divided into segments, masking the substrate using a drawing material so that segments having predetermined shapes are obtained, thereafter depositing the protective film, and then removing the masked part to form a spacing between segments.

5 Claims, 12 Drawing Sheets

(51) Int. Cl.
  *C23C 16/26* (2006.01)
  *C23C 14/04* (2006.01)

(56) References Cited

U.S. PATENT DOCUMENTS

| | | | |
|---|---|---|---|
| 5,377,045 A | | 12/1994 | Wolfe et al. |
| 2003/0108664 A1 | * | 6/2003 | Kodas ............... C09D 11/30 427/125 |
| 2006/0013997 A1 | | 1/2006 | Kuepper et al. |

FOREIGN PATENT DOCUMENTS

| | | | | |
|---|---|---|---|---|
| JP | 2-138468 | | 5/1990 | |
| JP | 2003-147525 | * | 5/2003 | ............ C23C 16/04 |
| JP | 2003147525 A | * | 5/2003 | |
| JP | 2003-347407 | | 12/2003 | |
| JP | 2006-28639 | | 2/2006 | |
| JP | 2007-311507 | | 11/2007 | |
| JP | 2009-38109 | | 2/2009 | |
| JP | 2009-90507 | | 4/2009 | |
| RU | 2003200 C1 | | 11/1993 | |

OTHER PUBLICATIONS

International Search Report, dated Dec. 21, 2010, corresponding to PCT/JP2010/066111, 6 pages.
Office action dated Sep. 18, 2013 issued in corresponding Chinese Patent Application No. 201080040167.0, 9pp.
Extended European Search Report for corresponding EP Application No. 16 15 8276.2, dated Apr. 29, 2016, 7pp.

* cited by examiner

PROGRAM-TEACHING BOX a b c d e f g h i j

PROTECTIVE FILM AND METHOD FOR PRODUCING SAME

CROSS-REFERENCE TO RELATED APPLICATION

This application is a National Phase Patent Application and claims the priority of International Application Number PCT/JP2010/066111, filed on Sep. 10, 2010, which claims priority of Japanese Patent Application Number 2009-210740, filed on Sep. 11, 2009.

TECHNICAL FIELD

The present invention relates to protective films having segmented shapes, obtained by depositing films to be divided into segments, and in particularly a diamond-like carbon (DLC) protective film, and to methods for producing the protective films.

BACKGROUND ART

In recent years, a technology for coating on a material surface a hard film that has long life and high reliability and can be used in a carefree manner has been sought, as a protective film for mechanical components or the like. In the field of coating a hard film, a hard carbon film, particularly diamond-like carbon (DLC), has been highly evaluated as a material that enhances the slidability of a component by forming a film on a component surface. DLC is a material that contains carbon as a main component, is generally amorphous while carbon atoms have graphite $sp^2$ bonds and diamond $sp^3$ bonds, and exhibits intermediate physical properties between graphite and diamond. In addition, it is known to have low coefficient of friction and high wear resistance due to its film characteristics and surface smoothness and has been widely utilized as a surface coating that enhances slidability, on the sliding planes of various machines, tools, internal combustion engines and the like.

However, when external force is applied to a substrate on which a hard film such as DLC is deposited in order to improve wear resistance, the substrate is deformed to apply large distortion to the hard film and to sometimes peel off the hard film from the substrate. In order to solve this, there was suggested a protective film having a segmented shape, wherein a film formed divided into segments is deposited on a substrate (Patent Literature 1).

It is known that, to obtain such a protective film having a segmented shape, a substrate is masked using a wire gauze of a tungsten wire or the like and a protective film is thereafter deposited (Patent Literature 1). More specifically, the parts corresponding to wire gauze meshes constitute segments by performing masking using a wire gauze of a tungsten wire or the like, a lattice-shaped segmented film is obtained, and wire gauze parts, namely, the parts corresponding to the net wires of the wire gauze constitute spacings between adjacent segments.

CITATION LIST

Patent Literature

Patent Literature 1
U.S. Pat. No. 4,117,388

SUMMARY OF INVENTION

Technical Problem

A segmented shape by masking using a wire gauze is limited by the processability (degree of freedom) of the wire gauze. For example, since the net wires of an ordinary wire gauze have a uniform thickness, a film deposited in the meshes of the wire gauze may only have a constant thickness. In addition, since the meshes of an ordinary wire gauze are uniform, the shapes of segments are difficult to change correspondingly to the portion on which a film is formed. In addition, even masking by a wire gauze can be relatively easily applied when a substrate to be masked is planar while the application of the masking by the wire gauze is difficult when the substrate has a three-dimensional shape. For example, for covering a three-dimensional body, it is necessary to finely divide a planar wire gauze correspondingly to planes constituting the three-dimensional body and connect the divided portions, which requires a lot of time and effort, maintenance of the uniformity of segmented shapes at every batch becomes difficult, and the quality control of a protective film is further precluded.

Objects of the present invention are: to provide a DLC film, wherein a protective film having a segmented shape is easily formed, quality control of the protective film is improved, segmented shapes with a high degree of freedom (that are complicated) are possible, and the application of the DLC film is possible not only to two-dimensional shapes but also to three-dimensional shapes; and to provide a method for forming the DLC film.

Solution to Problem

According to the present invention, provided are:

(1) A protective film obtained by, when forming on a substrate the protective film having a segmented shape formed by depositing a film so that the film is formed divided into segments, masking the substrate using a drawing material so that segments having predetermined shapes are obtained, thereafter depositing the protective film, and then removing the masked part to form a spacing between segments.

(2) A protective film obtained by, when forming on a substrate the protective film having a segmented shape formed by depositing a film so that the film is formed divided into segments, groove-processing the substrate using a cutting tool so that segments having predetermined shapes are obtained, and thereafter depositing the protective film to form a spacing between segments.

(3) The protective film according to (1) or (2), wherein a substrate surface has a three-dimensional shape.

(4) The protective film according to any one of (1) to (3), wherein the protective film is formed by a vapor phase deposition method.

(5) The protective film according to any one of (1) to (4), wherein, in the protective film having a segmented shape, 95% or more of a corner between the top and side of each segment is curved with a radius of curvature that is not less than the film thickness of the protective film.

(6) The protective film according to any one of (1) to (5), wherein the protective film comprises any or a combination of diamond, diamond-like carbon, BN, $W_2C$, CrN, HfN, VN, TiN, TiCN, $Al_2O_3$, ZnO and $SiO_2$ films.

(7) The protective film according to (1) or any one of (3) to (6), wherein the drawing material comprises a conductive material.

(8) The protective film according to (1) or any one of (3) to (6), wherein the drawing material comprises a semiconductor material or an insulating material.

(9) The protective film according to (1) or any one of (3) to (6), wherein the drawing material comprises a resist material.

(10) The protective film according to (1) or any one of (3) to (9), wherein the substrate is masked with the drawing material using an articulated robot including a drawing mechanism.

(11) The protective film according to (10), obtained by:
applying a resist material on a substrate surface;
drying the resist material to form a resist layer on the substrate surface;
curing a light-irradiated portion of the resist layer by irradiating the resist layer with light using a light irradiation mechanism made of an optical fiber, which light irradiation mechanism is included in an arm unit of an articulated robot;
masking the substrate with the light-irradiated portion of the resist layer by removing a non-light-irradiated portion of the resist layer by chemical cleaning;
depositing the protective film on the masked substrate; and
removing the mask.

(12) The protective film according to any one of (2) to (6), wherein a substrate surface is groove-processed using a cutting tool included in an arm unit of an articulated robot.

(13) A method for producing a protective film, comprising, when forming on a substrate a protective film having a segmented shape formed by depositing a film so that the film is formed divided into segments, masking the substrate using a drawing material so that segments having predetermined shapes are obtained, thereafter depositing the protective film, and then removing the masked part to form a spacing between segments.

(14) A method for producing a protective film, comprising, when forming on a substrate a protective film having a segmented shape formed by depositing a film so that the film is formed divided into segments, groove-processing the substrate using a cutting tool so that segments having predetermined shapes are obtained, and thereafter depositing the protective film to form a spacing between segments.

(15) The method according to (13) or (14), wherein a substrate surface has a three-dimensional shape.

(16) The method according to any one of (13) to (15), wherein the protective film is formed by a vapor phase deposition method.

(17) The method according to any one of (13) to (16), wherein, in the protective film having a segmented shape, 95% or more of a corner between the top and side of each segment is curved with a radius of curvature that is not less than the film thickness of the protective film.

(18) The method according to any one of (13) to (17), wherein the protective film comprises any or a combination of diamond, diamond-like carbon, BN, $W_2C$, CrN, HfN, VN, TiN, TiCN, $Al_2O_3$, ZnO and $SiO_2$ films.

(19) The method according to (13) or any one of (15) to (18), wherein the drawing material comprises a conductive material.

(20) The method according to (13) or any one of (15) to (18), wherein the drawing material comprises a semiconductor material or an insulating material.

(21) The method according to (13) or any one of (15) to (18), wherein the drawing material comprises a resist material.

(22) The method according to (13) or any one of (15) to (21), wherein the substrate is masked with the drawing material using an articulated robot including a drawing mechanism.

(23) The method according to (22), further comprising:
applying a resist material on a substrate surface;
drying the resist material to form a resist layer on the substrate surface;
curing a light-irradiated portion of the resist layer by irradiating the resist layer with light using a light irradiation mechanism made of an optical fiber, which light irradiation mechanism is mounted on an arm unit of an articulated robot;
masking the substrate with the light-irradiated portion of the resist layer by removing a non-light-irradiated portion of the resist layer by chemical cleaning;
depositing the protective film on the masked substrate; and
removing the mask.

(24) The method according to any one of (14) to (18), wherein a substrate surface is groove-processed using a cutting tool mounted on an arm unit of an articulated robot.

Advantageous Effects of Invention

In accordance with the present invention, a DLC film, wherein a protective film having a segmented shape is easily formed, quality control of the protective film is improved, segmented shapes with a high degree of freedom (that are complicated) are possible, and the application of the DLC film is possible not only to two-dimensional shapes but also to three-dimensional shapes; and a method for forming the DLC film are provided.

BRIEF DESCRIPTION OF DRAWINGS

FIG. 9b illustrates a photograph of one embodiment in the method according to the present invention, in which a DLC film is deposited on the spherical structure in FIG. 9a.

DESCRIPTION OF EMBODIMENTS

Figure 1:
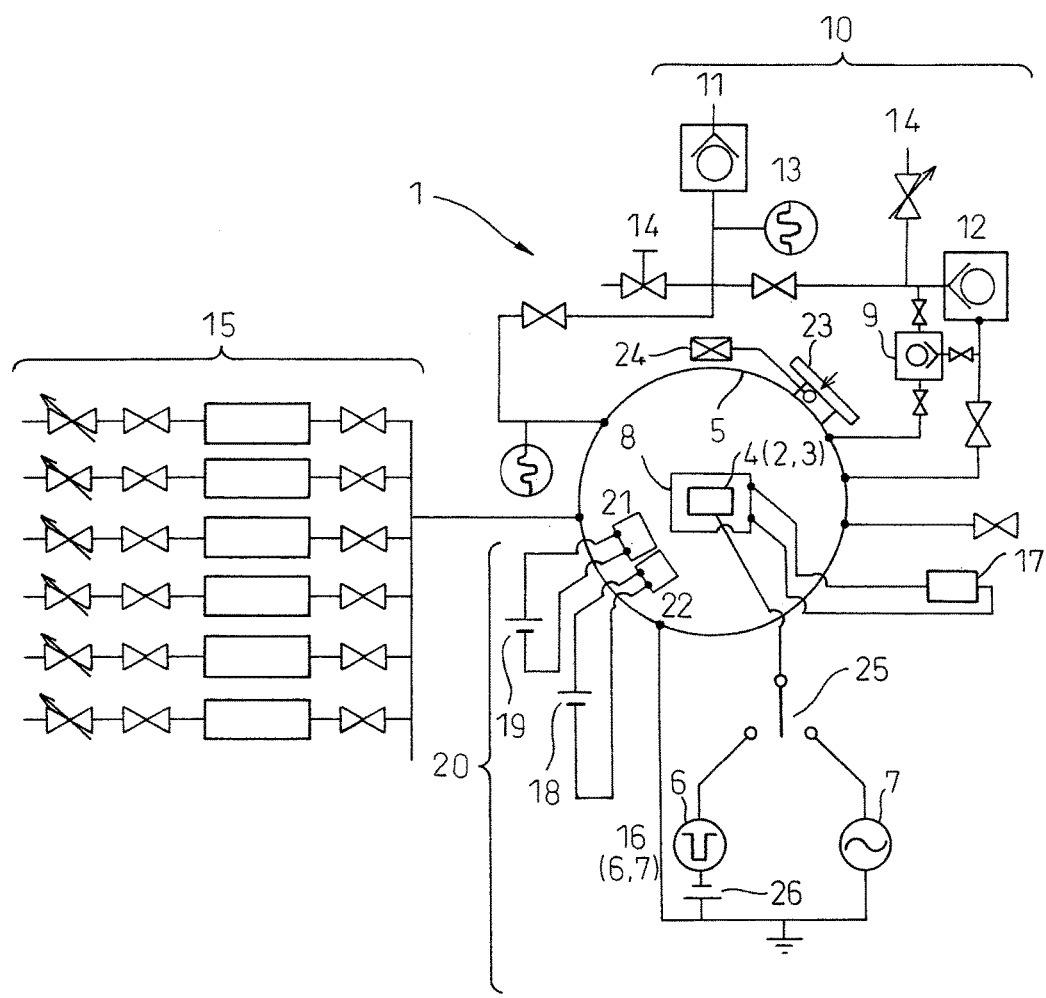
FIG. 1 illustrates the scheme of an apparatus that produces a protective film.

The protective film according to the present invention is characterized by, when forming on a substrate the protective film having a segmented shape formed by depositing a film so that the film is formed divided into segments, masking the substrate using a drawing material so that segments having predetermined shapes are obtained, thereafter depositing the protective film, and then removing the masked part to form a spacing between segments.

Alternatively, an embodiment of the present invention is the protective film obtained by, when forming on a substrate the protective film having a segmented shape formed by depositing a film so that the film is formed divided into segments, groove-processing the substrate using a cutting tool so that segments having predetermined shapes are obtained, and thereafter depositing the protective film to form a spacing between segments.

The protective film according to the present invention is described in detail below. It is necessary that the protective film according to the present invention should have a segmented shape formed by depositing a film so that the film is formed divided into segments. The segments have shapes that are not particularly limited but may appropriately be selected from triangles, quadrangles, circles and the like. The segments have sizes that are usually selected from one side or an outside diameter of 1 μm to 3 mm. The spacing between adjacent segments is usually 0.1 μm to 1 mm. In addition, the segments usually have film thicknesses of 1 nm to 200 μm.

In accordance with the present invention, the substrate is masked using the drawing material in sizes and shapes corresponding to segment spacing parts so that the segments having predetermined shapes are obtained. The drawing-masking may be performed by the drawing mechanism using various printing techniques such as handwriting, ink-jet printing, offset printing, gravure printing, flexographic printing, type printing, screen printing and photolithographic printing. Particularly, ink-jet printing or photolithographic printing is preferred. This is because the degree of freedom for change of masking condition is high and its application to a three-dimensional substrate is easy. Since a drawing (printing) pattern may freely be set, i.e., a different segment pattern may be applied on each substrate, the protective film having an optimal segment structure depending on its application can be obtained. The possibility of setting the drawing (printing) pattern means that marking or naming can also be performed using the protective film with a segmented structure. Contact-drawing (contact-printing) of the substrate enables marking or name-removal by removing (peeling) the drawing material after formation of the film. Furthermore, by changing the location, size and range of the segmented structure, the width and bending manner of a groove after removal of the drawing material can also freely be controlled, and the groove can also easily be used as a flow path. In addition, in the drawing (printing), a thickness may be adjusted. The thickness can be adjusted by, e.g., coating several layers of the drawing materials, and, thereby, the thickness of the accumulated film can also be changed. In the drawing (printing), a mesh may optionally be changed, and a fine segmented structure and a large segmented structure may gradationally be set. This makes it possible to change a light transmission level in the protective film. A pattern (figure), a film thickness and a gradation may also freely be combined.

The drawing material is appropriately selected in consideration of safety, keeping quality, application properties (such as degrees of adhesion, repellency, bleeding and wetting to an opposite material) and the like. For example, when a drawing material (ink) for ink-jet printing is used, a pigment is recommended to have a size of about 1 μm or less and a viscosity of about 3 mPa·s or less. It is desirable to dry the drawing material by a method specified by an ink manufacturer, forced drying such as an electrical drying oven or warm air drying, or the like after drawing (printing). The ink may also be supplied from an ink tank, or, when the ink is easy to deposit, a mechanism that stirs or the like so that the ink becomes in an appropriately mixed state prior to drawing (printing) may also be included.

The drawing material may also contain a conductive material. Examples of the conductive material are carbon-containing materials, ITO inks and the like. The drawing material containing a conductive material may be utilized as a conductive path when an electric action is utilized during forming a film. For conductivity in this case, an electric resistivity is desirably $10^5$ Ω·m or less. This is because the electric resistivity ensures conductivity when a voltage of 3 kV or more is applied.

The drawing material may contain a semiconductor material or an insulating material. Examples of the semiconductor material are polymeric materials containing polycrystalline silicon, and examples of the insulating material are polymeric materials containing silica particles. The drawing material preferably has an electric resistivity ranging from $10^5$-$10^6$ Ω·m in the case of the semiconductor whereas the drawing material preferably has an electric resistivity ranging from $10^6$-$10^{17}$ Ω·m in the case of the insulating material. This is because the function of the drawing material as an auxiliary electrode is decreased to inhibit an electric current from passing and to decrease a film formation rate, with increasing the electric resistivity of the drawing material, when a DLC film is formed, while increase in the temperature of the substrate can be suppressed, and therefore the drawing material having a suitable electric resistivity can be selected in consideration of the heat resistance of the substrate.

The drawing material may also contain a resist material. The resist material, which is a photosensitive polymeric material, is cured by a beam generated by a light irradiation (drawing) mechanism such as a laser drawing apparatus or an electron beam drawing apparatus. When the resist material is applied to a substrate and is dried, a resist layer is formed. When the resist layer is irradiated with a beam, the part that has been irradiated with the beam is cured whereas the part that has not been irradiated with the beam is not cured. The part that is not cured can be removed by chemical cleaning. After the removal of the non-cured portion (non-irradiated portion), a mask pattern is formed. Examples of the resist material are a positive type resist including a novolac resin and a diazonaphthoquinone (DNQ) compound, and the like.

In another embodiment of the present invention, a substrate may also be groove-processed using a cutting tool, in place of the masking with the drawing material, followed by depositing the protective film to form a spacing between segments. The width of the groove is selected from the range of 0.1 μm to 1 mm, the spacing of adjacent segments. The depth of the groove by the cutting tool is selected from the range of around 2 μm to 2 mm. This is because it is currently difficult to uniformly introduce a groove of 2 μm or less due to cutting precision, the lower limit is therefore around 2 μm, and a groove depth of 2 mm or more causes significant deformation due to the shearing stress of a convex part (namely segmented part) to deteriorate characteristics in the protective film. The cross-sectional shape of the groove is optional and is selected from, e.g., a V-shape, a U-shape, etc. As the cutting tool, an appropriate conventional tool may be used depending on the material of the substrate and the desired dimension and shape of the groove, and, for example, a dicer, a diamond micro-router or the like may be used. Only a groove depth corresponding to a film thickness, or equivalently, a groove depth of several nanometers to several hundred micrometers can be obtained in the protective film having a segmented structure made by being masked with the drawing material while a groove with a depth of around 1 mm can easily be made according to this method of groove-processing the substrate using the cutting tool. Since a deposited film has a thickness of several nanometers to several hundred micrometers and a groove depth is around 2 μm to 2 mm, the protective film deposited after the groove-processing of the substrate is divided by grooves to obtain the protective film having a segmented shape.

When used as a protective film for improvement in wear resistance, the protective film having a segmented structure, formed on the substrate with a groove having a depth of 1 mm has around 1.5 times improved wear resistance in comparison with the protective film made by being masked with the drawing material. This is because stress applied to the film is decreased by performing the groove-processing. The effect of the groove-processing is high in the case of a comparatively low load of 1 N or less while no cutting is more effective in the case of a sphere of 6 mm in diameter and a vertical load of 1 N or more. This is because the substrate per se is deformed by applying cutting.

Since trapping of an abrasion powder in a groove is effective for suppressing abrasive wear (a damaged protective film as a friction agent attacks the remaining protective film to accelerate wear), the protective film having deep grooves made by this method is effective when severe abrasive wear occurs. However, since the shear resistance of a substrate surface is decreased, this method is not appropriate but it is appropriate to use the protective film having a segmented structure made by being masked with the drawing material, when a vertical load (force applied to a protective film by an opposite material) is large during sliding, or specifically, when applied force equivalent to 1/10 or more of the yield stress of the substrate is applied.

Substrates used in accordance with the present invention are not particularly limited but include, for example, metals such as aluminum, magnesium, alloys thereof and steel; plastics; rubbers; ceramics; composite materials thereof; and the like, and may appropriately be selected depending on a purpose.

The surface of the substrate on which the protective film is deposited may have a three-dimensional shape. The three-dimensional shape is a plane, particularly a curved plane, made by plasticity processing such as machine processing or press processing, casting, or the like. For such planes, processing such as machine processing, electrical-discharge processing, hand work or abrasive finishing is also used. These planes are defined as three-dimensional shapes as used herein. For ship screws and the like, a brass cast product is finished by machine processing and details are subjected to hand work. In addition, convex and concave lenses are subjected to abrasive finishing, and aspherical lenses are subjected to casting+abrasive finishing. There are various planes in every industrial field, which planes are widely used, and the protective film according to the present invention can be deposited on such various, complicated three-dimensional shapes.

After the masking-drawing of the substrate, a film is deposited. The film is deposited on an unmasked spot to obtain the segment-shaped protective film. No film is deposited on a masked part, which constitutes a spacing between adjacent segments.

Alternatively, a film is deposited after the groove-processing of the substrate.

A vapor phase deposition method is preferably applied as a protective film deposition method, of which examples include plasma CVD with a direct-current power source, an alternating-current power source, a high frequency power source, a pulsed power source or the like as a power source, or a sputtering method such as magnetron sputtering or ion beam sputtering. The fundamental constitution of the film formation apparatus is illustrated in FIG. 1. Illustrated is the scheme of the apparatus equipped with a chamber 5, an exhaust system 10 (a rotary pump 11, a turbo molecular pump 12, a vacuum gauge 13, an exhaust valve 14, etc.), a gas introduction system 15 (a valve for introducing gases such as Ar, $C_2H_2$, $Si(CH_3)_4$), $H_2$, $O_2$, $N_2$, $CH_4$ and $CF_4$) and a power source system 20 (main power source 16, a substrate heating power source 17, a fine particles trapping filter power source 18, a surplus electrons collecting power source 19 and the like).

Figure 2:
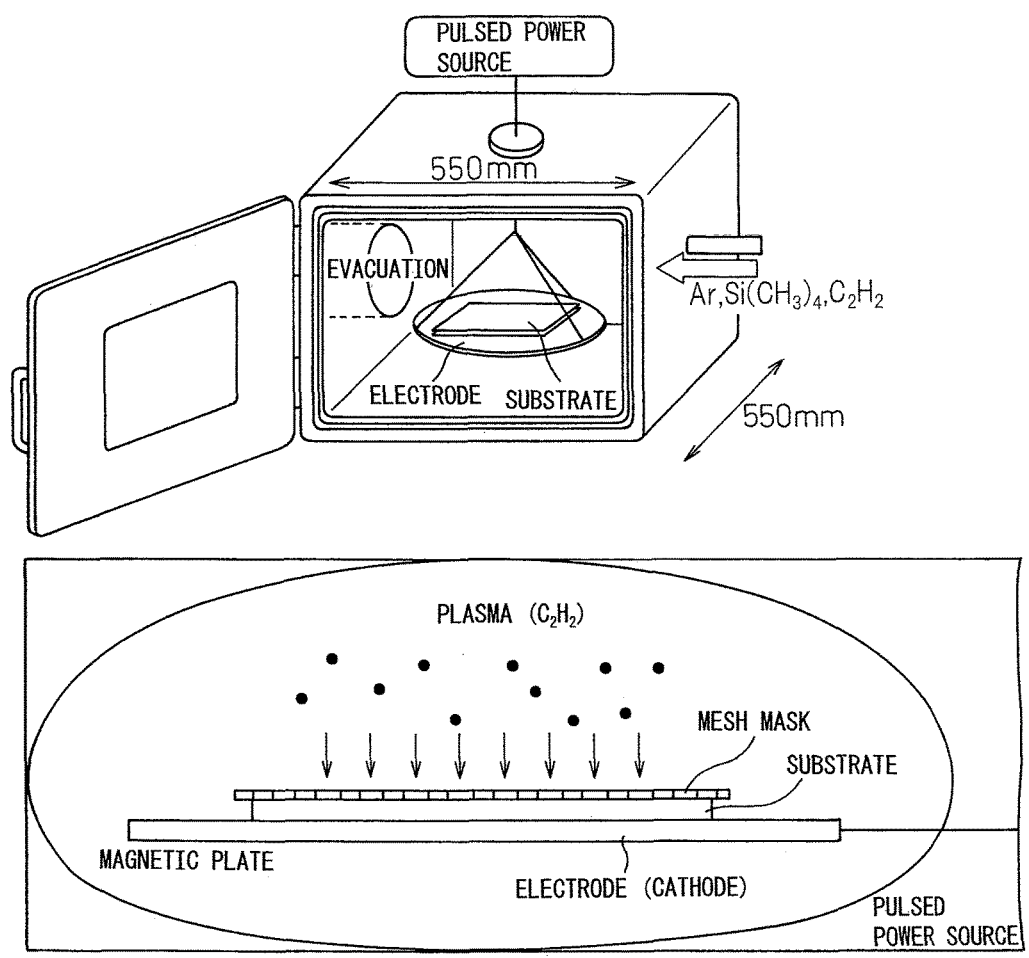
FIG. 2 illustrates the scheme of a mechanism that forms a protective film on a substrate in the apparatus according to FIG. 1.

The scheme of the mechanism that forms a protective film on a substrate in the apparatus according to FIG. 1 is illustrated in FIG. 2. The substrate is placed on an electrode in a chamber in this apparatus, and the substrate is masked. Air is exhausted from the inside of the chamber by an evacuation mechanism after the placing of the substrate, plasma gas sources, Ar, $Si(CH_3)_4$, $C_2H_2$ and the like are then supplied, a pulsed voltage is applied by a pulsed power source, and the plasma gas sources are made to be plasma. The gas made to be the plasma is deposited on the substrate using the masking to obtain the protective film having a segmented shape.

The deposited protective film may preferably be imparted with wear resistance and may contain any or a combination of, e.g., diamond, diamond-like carbon, BN, $W_2C$, CrN, HfN, VN, TiN, TiCN, $Al_2O_3$, ZnO and $SiO_2$ films. The thicknesses of these films are selected usually from 1 nm to 200 μm.

After the deposition of the protective film, a masked part is removed. The masked part (drawing material) can be removed without damaging the substrate by appropriate physical and chemical procedures. As the physical removal methods, for example, sandpaper and sandblast can be used. The chemical removal methods include, for example, a method of dissolution by a solvent that is appropriately selected depending on a drawing material.

In the protective film having a segmented shape in accordance with the present invention, a corner between the top and side of each segment (shoulder of each segment), which corner is not sharp but is round, is obtained. More specifically, 95% or more of the corner is curved with a radius of curvature that is not less than the film thickness of the protective film. This is because the protective film is deposited via the masking, flying of deposited film components (carbon and the like) is therefore blocked by the masked substrate part and the vicinity thereof, and consequently the corner that is not sharp but is round is obtained. When the protective film having the segmented shape that is gently round is used in a mechanical component, particularly in the sliding plane thereof, effects of the stability of sliding friction and long life are shown.

Figure 3:
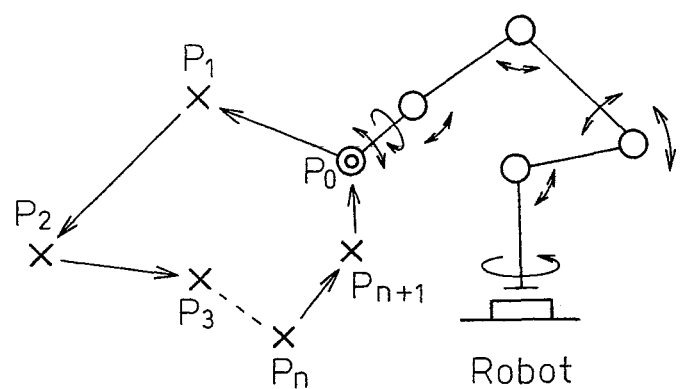
FIG. 3 illustrates the scheme of an articulated robot that draws masks on a substrate.
Figure 3:
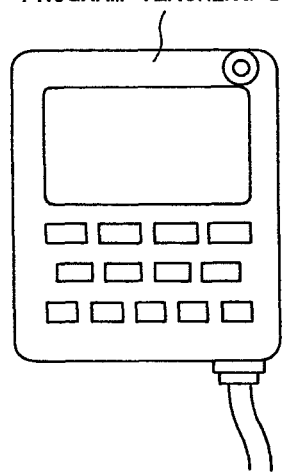

The protective film according to the present invention may be produced using an articulated robot with a drawing mechanism. The articulated robot is generally equipped with shafts of which the number is four, five or six. The number of the shafts indicates the number of rotation articulations, and, with increasing the number of the articulations, the number of movable units is increased to increase the degree of the freedom of the posture of an operation unit (generally placed on the top of an arm). The operation unit of the articulated robot is equipped with the drawing mechanism. Examples of the drawing mechanism are writing instruments, the printer heads of ink-jet printers, and the like. The masking-drawing of the substrate is performed by linking or collaboration between the working of the arm of the articulated robot and the drawing operation by the drawing mechanism. A tank in which a drawing material (ink) is put may also be placed in the vicinity of the drawing mechanism and is preferably placed in the location that does not interfere with printing and the movement of the arm. The drawing material is supplied to the drawing mechanism on the basis of an ink-jet system. The scheme of the articulated robot that drawing-masks the substrate is illustrated in FIG. 3. Since, generally, the accuracy of the position of a robot is ±0.08 mm (80 μm) and the thickness of a drawn line is 50 μm±10 μm, 80+10≈100 μm (0.01 mm) can be regarded as the precision of the drawn line even if the thickness of the line is varied with a distance between a matter to be printed and the drawing mechanism (head).

In FIG. 3, the robot arm is at $P_0$ (home position) in an initial state. Instructions of moving the arm and an event (working) at each point (P) are selected by operating each button of a teaching box, to perform input. This sequence is repeated, and E.O.P. (end-of-program) is input to complete a program. The arm need not be located at the home position at the time of E.O.P.

Figure 4:
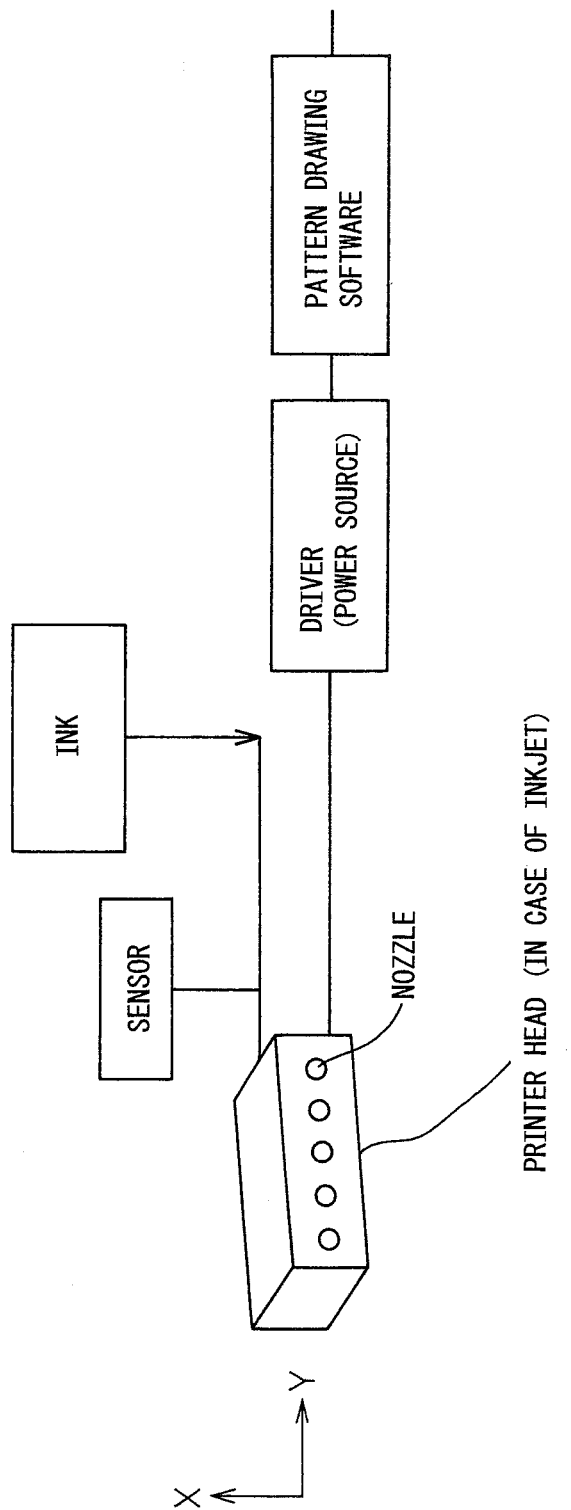
FIG. 4 illustrates an example (ink-jet printer head) of a drawing-masking mechanism.

An installation example of the drawing mechanism (ink-jet printer head) is illustrated in FIG. 4. The ink-jet printer includes a printing mechanism including: ink discharge nozzles; a driver (power source) that makes and stops the nozzles discharge of ink; pattern drawing software that gives a drawing instruction to the driver; an ink cartridge (ink tank) for supplying ink; and the like.

In one embodiment of the present invention, the printer head may also be installed on the top of the robot arm to fit the working reference point of the robot arm (three-dimensional movement mechanism). The arrangement of the ink discharge nozzles and the movement of the robot arm can be adjusted to adopt coordinates of which the X-Y directions are common. Ink is supplied to the printer heads, discharged from the nozzles and sprayed on an object (substrate) to draw a desired pattern, according to the instruction from the driver.

In another embodiment of the present invention, a cutting tool for groove-processing may also be installed in place of the printer head.

Figure 5:
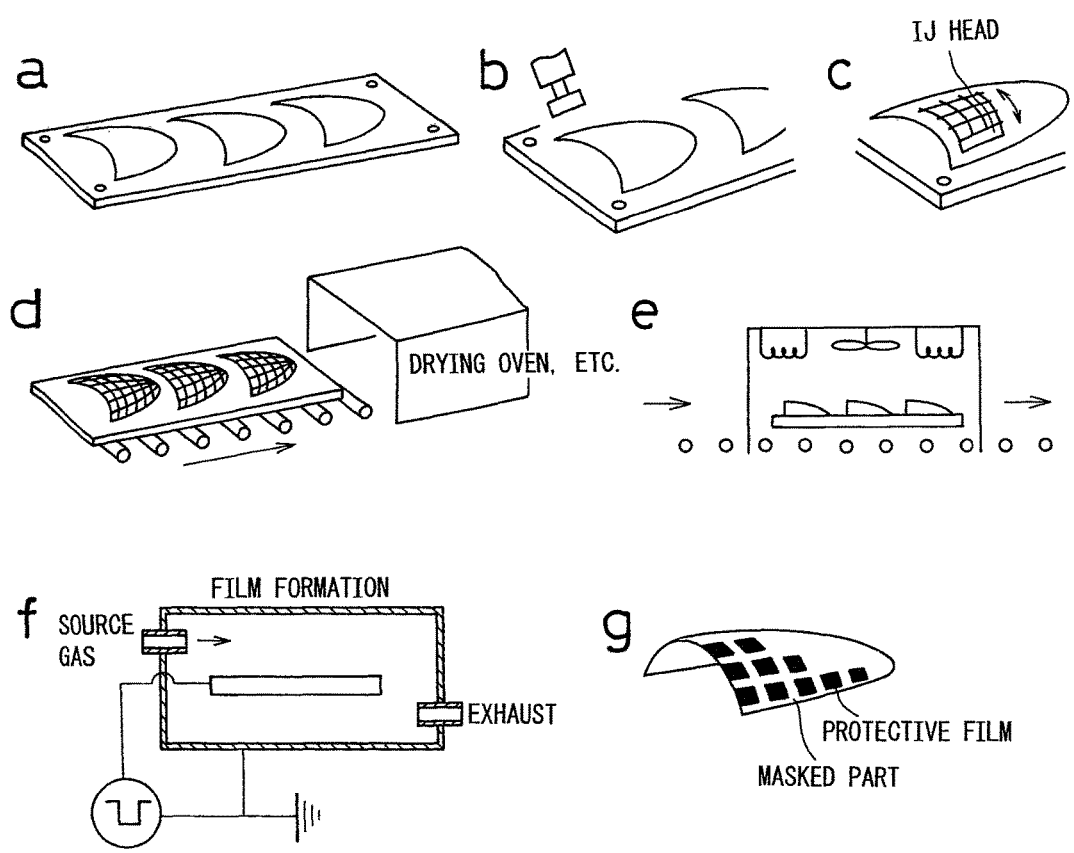
FIG. 5 illustrates a process flow of drawing-masking.

A process flow of drawing-masking is illustrated in FIG. 5. a) The substrate (workpiece) is set in a jig, b) a drawing instruction is given to the robot (three-dimensional movement mechanism), c) the robot makes the ink-jet head approach a predetermined location in the workpiece, and ink is discharged from the inkjet to draw a desired pattern, d) the substrate (workpiece) is transferred (together with a jig cassette) to a drying step, e) the ink on the substrate (workpiece) is dried, and the dried and adhered ink becomes a mask, f) a film is then produced, and g) a protective film having a desired segmented shape is obtained by removing the mask after the production of the film. In place of the drawing, groove-processing may also be performed.

Figure 6:
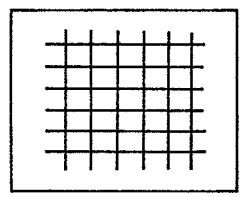
In FIG. 6, a-f illustrate examples of planar drawn patterns, and g-j illustrate examples of three-dimensional drawn patterns.
Figure 6:
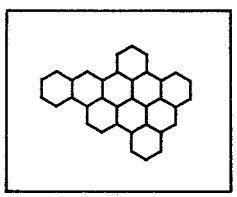
Figure 6:
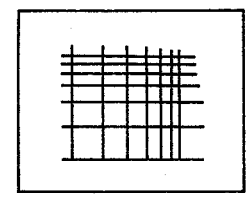
Figure 6:
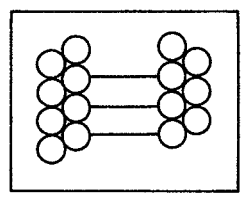
Figure 6:
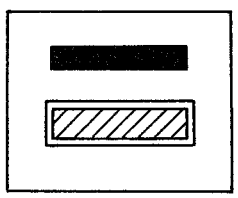
Figure 6:
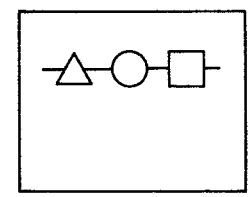
Figure 6:
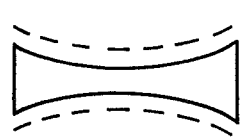
Figure 6:
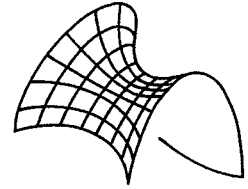
Figure 6:
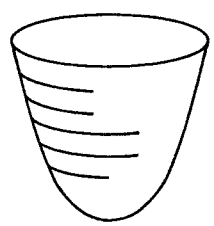
Figure 6:

In FIG. 6, a-f illustrate examples of planar drawn patterns, and g-j illustrate examples of three-dimensional drawn patterns. As the examples of the planar printed pattern, a illustrates a mesh, b illustrates a honeycomb-shaped mesh, c illustrates lines between which pitches are varied, d illustrates continuous circles linked by lines, e illustrates all one color and a partially shaded area, and f illustrates a pattern. As the examples of the three-dimensional planar printed pattern, g illustrates the inner sides of a concave lens (aspherical surface, etc.), h illustrates a saddle-shaped surface, i illustrates a three-dimensional parabola surface, and j illustrates a three-dimensional printed pattern on a sphere. These patterns are illustrations, and the drawing pattern according to the present invention is not limited thereto. In place of the drawing, these patterns can also be obtained by groove-processing.

Figure 7A:
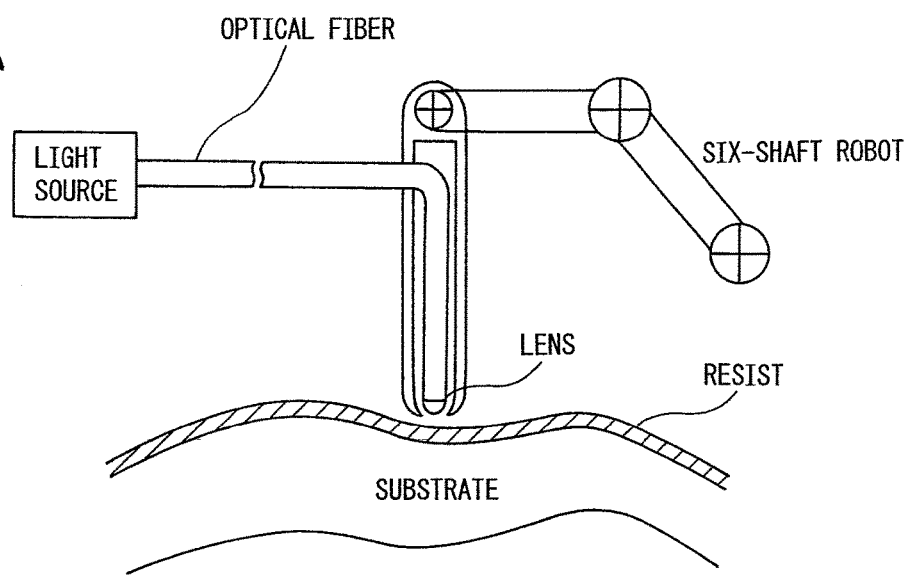
FIG. 7A illustrates an embodiment in the case of using a resist material as a drawing material.
Figure 7B:
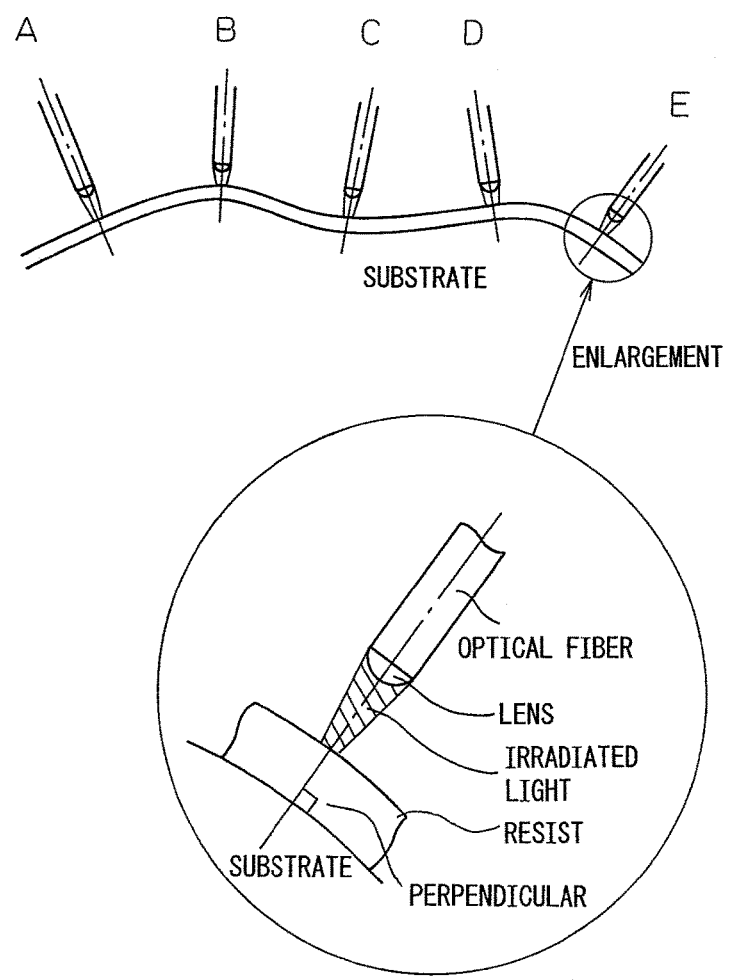
FIG. 7B illustrates an enlarged portion of the embodiment in the case of using the resist material as the drawing material.
Figure 8:
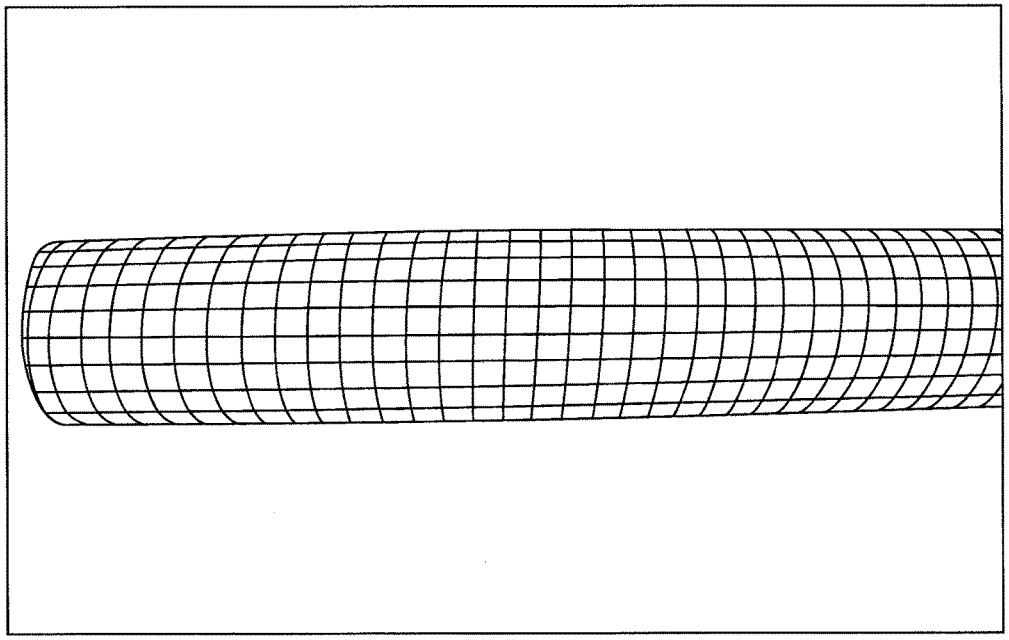
FIG. 8 illustrates a photograph of a DLC film having a segmented structure, obtained by the present invention.
Figure 9A:
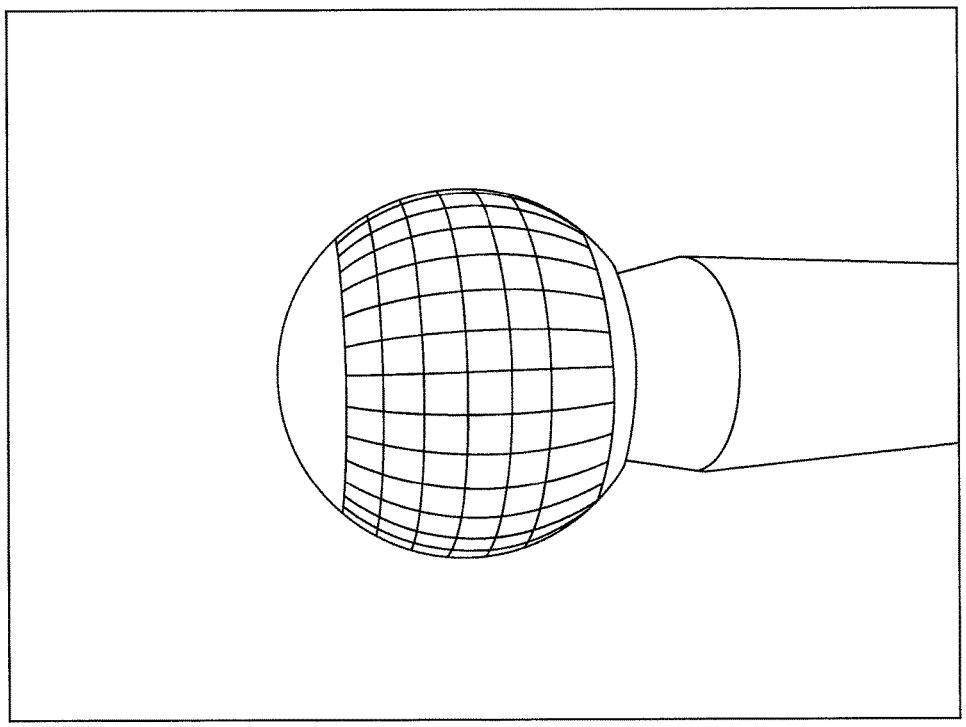
FIG. 9a illustrates a photograph of one embodiment in the method according to the present invention, in which a grid pattern is drawn with a conductive ink on a spherical structure.
Figure 9B:
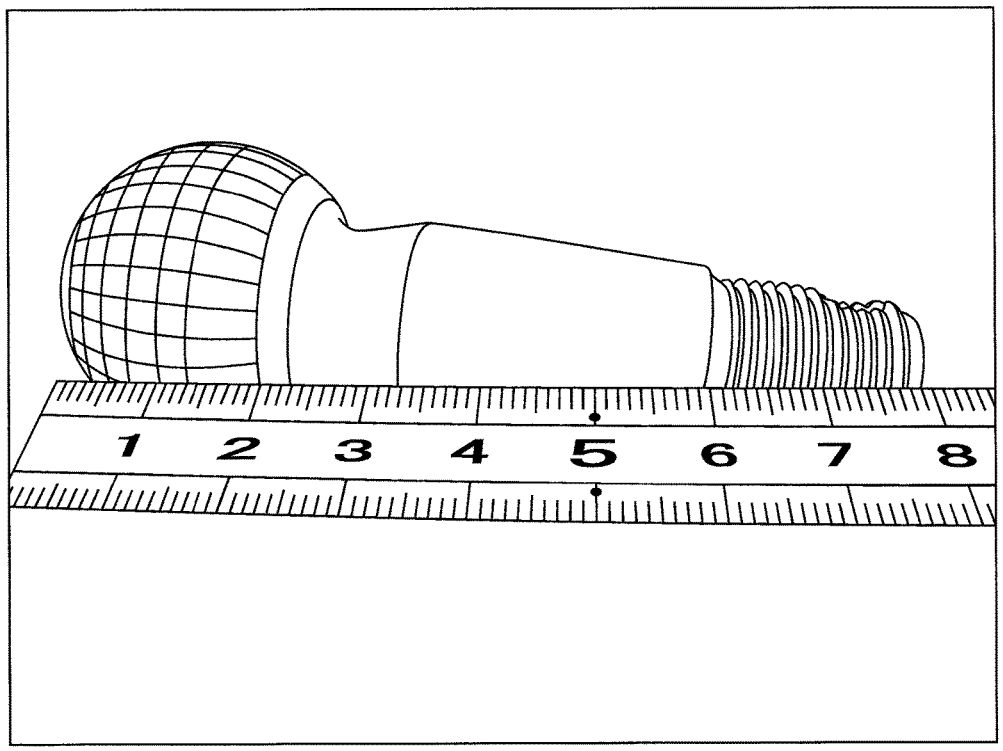
Figure 9C:
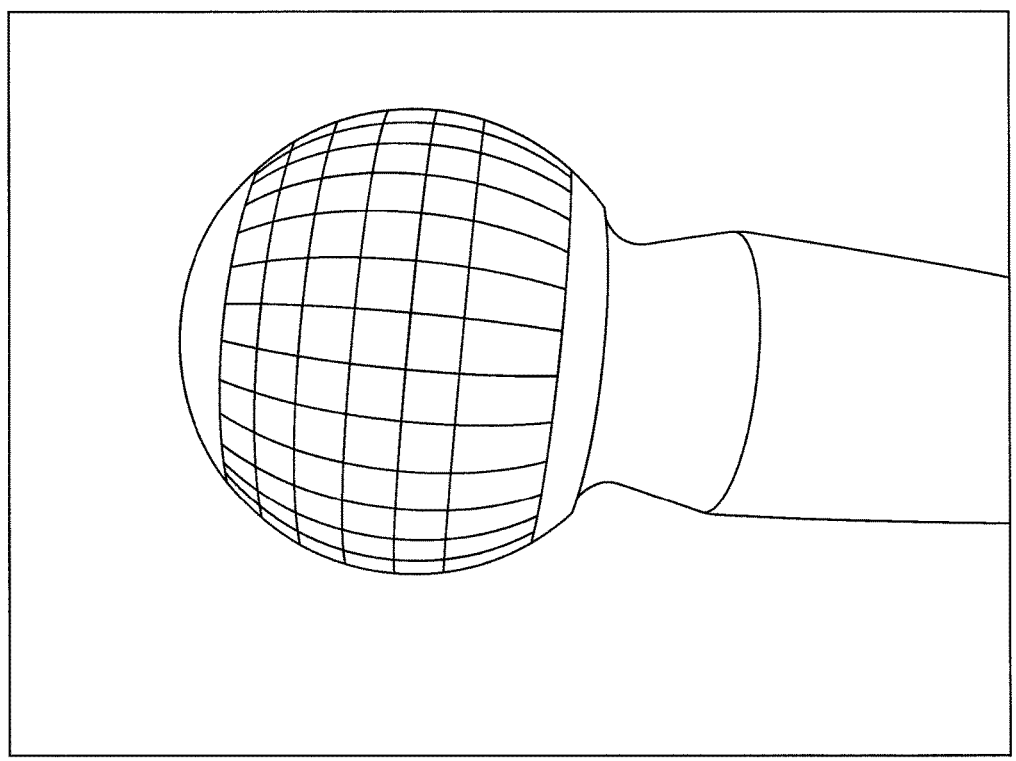
FIG. 9c illustrates an enlarged view of FIG. 9b.
Figure 9D:
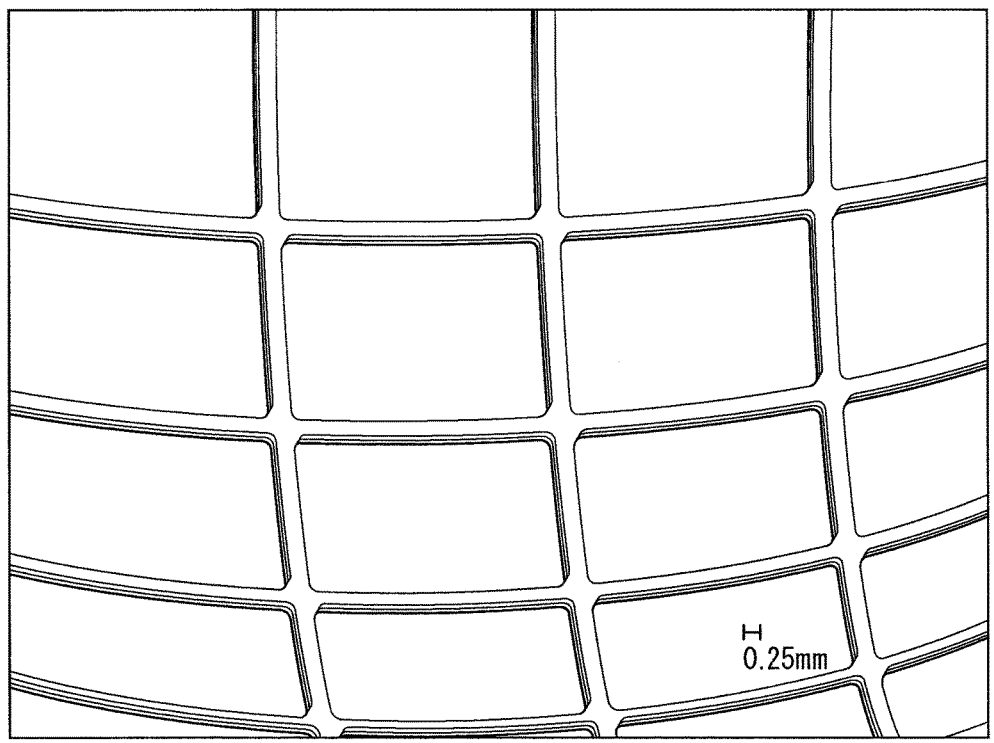
FIG. 9d illustrates a photograph of one embodiment in the method according to the present invention, in which the conductive ink is removed from the spherical structure in FIG. 9b.

In FIG. 7A and FIG. 7B, an embodiment in the case of using a resist material as a drawing material is illustrated. A light-irradiated portion of the resist layer can be cured to remain as a mask by irradiating the resist layer with light using a light irradiation mechanism made of an optical fiber, which light irradiation mechanism is mounted on the arm unit of the articulated robot.

FIG. 7A is a view of a system for light exposure to a curved surface using a six-shaft robot and a laser or ultraviolet light source. FIG. 7B is a model view of irradiation. In the system according to FIG. 7B, a substrate can always be irradiated perpendicularly with light, for example, by movement of A→B→C→D→E. Only an irradiated resist may be cured to remain, thereby being able to use the resist as a mask during forming a DLC film.

The present invention also relates to a method for producing the above-mentioned protective film according to the present invention.

EXAMPLES

Example 1

Using a six-shaft robot, lattice-shaped lines were drawn on the surface of a sample (pipe) having the curved surface. The material of the substrate of the sample is stainless steel. A drawing material in which Ketjen black was dispersed in polymers was used. A locus on a curved surface was continuously formed on a program by arc compensation, parabola compensation and free-curve compensation using a teaching function (function of moving the top of a robot above an actual article (workpiece) to read a coordinate from the actual article (workpiece)) and was drawn so that the top of the arm of the robot was always perpendicular to a plane. A drawing speed was 30 mm/s. The drawing material was dried, followed by forming a DLC film by a pulsed plasma CVD method. Film formation conditions are described below.

Film Formation Conditions

| Film formation method | Pulsed plasma CVD |
|---|---|
| Pressure | 3.0 Pa |
| Pulsed voltage | −5.0 kV |
| Frequency | 2.0 kHz |
| Pulse width | 20 μs |
| Intermediate layer formation gas | Tetramethylsilane |
| DLC layer formation gas | Acetylene |

After the formation of the film, the polymer substrate of a drawn portion was dissolved in acetone or alcohol to realize the DLC film. As illustrated in the photograph in FIG.

8, the DLC film having a segmented structure was confirmed to be uniformly formed on the curved surface. When the radii of curvature of 100 corners between the tops and sides of the respective segments (shoulders of the respective segments) were measured, all the 10 corners had the radii of curvature of 8-16 μm while a film thickness was 0.8 μm, and the radii of curvature of all the measured locations were larger than the film thickness.

Example 2

A resist was applied to a substrate to have a thickness of about 50 μm by an ultrasonic or spin coater, and the substrate was irradiated by condensing light from YAG lasers (1.06 μm) of a pulsed Q-switch to 30 μm at the top through an optical fiber from the top of the six-shaft robot to cure the resist on the irradiated portion. A linear pattern was formed by scanning the lasers at spacings of 200-300 μm. Position control was performed by the robot in the same manner as in Example 1 so that the curved surface can always be irradiated with the lasers from equal distances. A grid structure was made by further similarly performing scanning in a straight direction. Thereafter, a non-irradiated portion was removed by a remover, and a DLC film was then formed under the conditions described below by a radio-frequency plasma CVD method. Thereafter, the DLC film having a segmented structure was obtained by lift-off of the resist.

Film Formation Conditions

| Film formation method | Radio-frequency plasma CVD |
| --- | --- |
| Pressure | 3.0 Pa |
| Bias voltage | −450 V |
| Frequency | 13.56 MHz |
| Pulse width | 20 μs |
| Intermediate layer formation gas | Tetramethylsilane |
| DLC layer formation gas | Acetylene |

Example 3

Grooves with a depth of 20 μm was lengthwise and crosswise digged by a dicer with a width of 20 μm for dicing a Si wafer while performing position-control by the robot in the same manner as in Example 1, ultrasonic cleaning with acetone was performed, and thereafter a DLC film was formed under the conditions described below to obtain the DLC film having a segmented structure.

Film Formation Conditions

| Film formation method | Pulsed plasma CVD |
| --- | --- |
| Pressure | 3.0 Pa |
| Pulsed voltage | −2.0 kV |
| Frequency | 10 kHz |
| Pulse width | 20 μs |
| Intermediate layer | Cr sputtering |
| DLC layer formation gas | Acetylene |

Example 4

Grooves with a width of 20 μm and depths of 10-20 μm were made by a diamond micro router (grinding stone) while performing position-control by the robot in the same manner as in Examples 1-3, ultrasonic cleaning with acetone was performed, and thereafter a DLC film was formed under the same conditions as in Example 3 to obtain the DLC film having a segmented structure.

Example 5

On a spherical structure (ball stud=automobile component) of which the surface was cleaned with acetone, a conductive ink was drawn in a grid shape by the robot while performing position-control by the robot in the same manner as in Example 1-4 (photograph view 9a). Then, a DLC film was formed (photograph views 9b, c). Thereafter, the conductive ink was removed by ultrasonic cleaning with the acetone (photograph view 9d). The DLC film having a segmented structure in a grid shape was obtained on the sphere. Conditions and the like in each step were described in detail below.

The spherical structure (ball stud) was an automotive steering mechanism component. The specifications thereof were as follows:

Ball stud metal material; SCM435 with polished surface after induction hardening
Ball size; about 30 mm, full length of 70 mm
The drawing conditions were as follows:
Segment size; one side of 2600±100 μm
Groove width (drawing line width); 180±80 μm
Size of one ink drop; 65±5 μm
Film formation conditions for the DLC film were as follows:

Film Formation Conditions

| Film formation method | Pulsed plasma CVD |
| --- | --- |
| Pressure | 3.0 Pa |
| Pulsed voltage | −5.0 kV |
| Frequency | 10 kHz |
| Pulse width | 20 μs |
| Intermediate layer | Tetramethylsilane |
| DLC layer formation gas | Acetylene |

Conditions for removal (line peeling) of the conductive ink were as follows:
Line peeling Ultrasonic cleaning with acetone 2 hours
The dimensions and the like of the obtained DLC film were as follows:
DLC film thickness 0.96-1.1 μm
Segment size; One side of 2682 μm (2.682 mm)
Flute width (drawing line width); 206-232 μm

REFERENCE SIGNS LIST

1 Diamond-like carbon film formation apparatus
2 Substrate (to be film-formed)
3 Mask material
4 Member composed of substrate and mask material
5 Chamber
6 Direct current single pulse power source
7 High frequency power source
8 Heater
9 Cryosorption pump
10 Exhaust system
11 Rotary pump
12 Turbo molecular pump
13 Vacuum gauge
14 Leak valve
15 Gas introduction system
16 Main power source
17 Substrate heating power source
18 Fine particles trapping filter power source
19 Surplus electrons collecting power source
20 Power source system 21 Second electrode in diamond-like carbon film formation apparatus
22 Fine particles trapping filter in diamond-like carbon film formation apparatus
23 Flange for setting optical monitor
24 Optical monitor
25 Switch that selects either of direct current single pulse power source or high frequency power source
26 Direct-current power source for superimposing

The invention claimed is:

1. A method for producing a protective film comprising:
providing a substrate having a surface;
groove-processing the surface of the substrate using a cutting tool and without using a mask or a mask material to form grooves on the surface of the substrate, wherein a segmented surface of the substrate includes segments separated by the grooves; and
depositing a protective film on the segmented surface of the substrate by a vapor deposition method to form the protective film with a segmented shape, wherein the segments of the protective film are separated by spacing at and along the grooves, and wherein the protective film comprises one or more of diamond, diamond-like carbon, BN, $W_2C$, CrN, HfN, VN, TiN and TiCN films.

2. The method according to claim 1, wherein, in the protective film having a segmented shape, 95% or more of a corner between the top and side of each segment is curved with a radius of curvature that is not less than the film thickness of the protective film.

3. The method according to claim 1, wherein the substrate surface is groove-processed using a cutting tool mounted on an arm unit of an articulated robot.

4. The method according to claim 1, wherein the substrate surface has a three dimensional curved shape.

5. The method according to claim 1, wherein the substrate surface has a three dimensional shape, and wherein a portion of the three dimensional surface constitutes one or more of a curve shape, a saddle-shape, a parabolic shape and a spherical shape.

* * * * *